United States Patent [19]
Jeong et al.

[11] Patent Number: 5,969,572
[45] Date of Patent: Oct. 19, 1999

[54] LINEAR POWER AMPLIFIER AND METHOD FOR CANCELING INTERMODULATION DISTORTION SIGNALS

[75] Inventors: Yong-Chae Jeong, Anyang; Young Kim; Ik-Soo Chang, both of Seoul, all of Rep. of Korea

[73] Assignee: Samsung Electronics Co., Ltd., Rep. of Korea

[21] Appl. No.: 09/017,347

[22] Filed: Feb. 2, 1998

[30] Foreign Application Priority Data

| Jan. 31, 1997 | [KR] | Rep. of Korea | 97-3497 |
| Feb. 11, 1997 | [KR] | Rep. of Korea | 97-3941 |
| Feb. 13, 1997 | [KR] | Rep. of Korea | 97-4195 |
| Dec. 31, 1997 | [KR] | Rep. of Korea | 97-80596 |

[51] Int. Cl.$^6$ .................. H03F 1/26; H03F 1/00
[52] U.S. Cl. ......................... 330/149; 330/151
[58] Field of Search ................. 330/151, 149, 330/107, 129, 136

[56] References Cited

U.S. PATENT DOCUMENTS 5,304,945  4/1994  Myer ........................... 330/149
5,867,064  2/1999  Van Horn et al. ............ 330/149
5,874,856  2/1999  Van Horn ..................... 330/151

*Primary Examiner*—Robert Pascal
*Assistant Examiner*—Patricia T. Nguyen
*Attorney, Agent, or Firm*—Dilworth & Barrese

[57] ABSTRACT

A feedforward-type linear power amplifier directly compares amplitude and phase of a signal applied to one input end of a first signal canceler with amplitude and phase of a signal applied to another input end of the first signal canceler, and according to the comparison results, controls a first variable attenuator and a first variable phase shifter disposed in a pre-stage of the first signal canceler so that the first signal canceler extracts only the intermodulation distortion signals generated while a main power amplifier amplifies the RF input signal. Then, the linear power amplifier directly compares amplitude and phase of the intermodulation distortion signal on a main path with amplitude and phase of the intermodulation distortion signal on a sub path, and according thereto, controls a third variable attenuator and a third variable phase shifter to cancel the intermodulation distortion signals contained in the RF output signal of the main power amplifier.

12 Claims, 10 Drawing Sheets

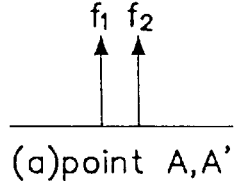
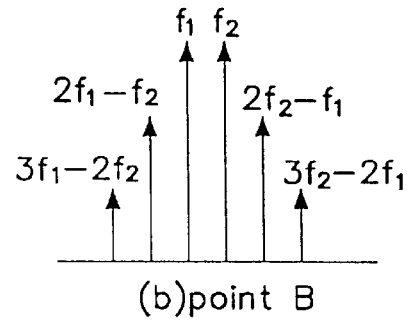
FIG. 2A
(PRIOR ART)
FIG. 2B
(PRIOR ART)
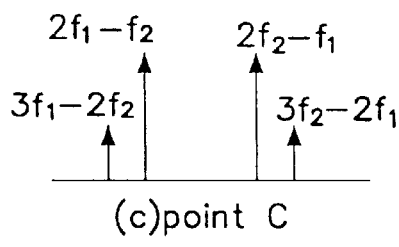
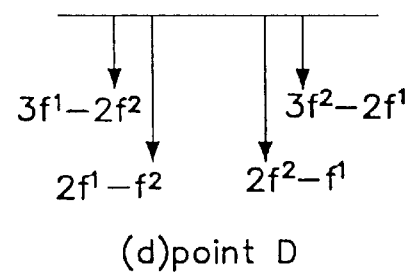
FIG. 2C
(PRIOR ART)
FIG. 2D
(PRIOR ART)
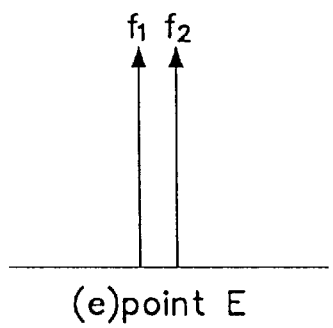
FIG. 2E
(PRIOR ART)

LINEAR POWER AMPLIFIER AND METHOD FOR CANCELING INTERMODULATION DISTORTION SIGNALS

BACKGROUND OF THE INVENTION

1. Field of the Invention

The present invention relates to a linear power amplifier, and in particular, to a feedforward-type linear power amplifier and a method for canceling intermodulation distortion signals contained in an amplified RF signal.

2. Description of the Related Art

An RF (Radio Frequency) amplifier used for a communication system includes elements having nonlinear characteristics at high power levels. An output signal amplified by the RF amplifier may include intermodulation distortion signals in the process of amplification due to the nonlinear characteristics of the RF amplifier. Such intermodulation distortion signals cause interference and distortion at an operating frequency range of the RF amplifier.

There are several known methods for controlling a linear power amplifier (LPA) which suppresses such distortion signals: a first known method is a predistortion method for generating an inverse distortion signal to apply it to an input end of the amplifier; a second known method is a negative feedback method for negatively feeding back the distortion signals together with the its output signal to an input end to suppress the distortion signals; and a third known method is a feedforward method for extracting the distortion signals and inverting phase of the distortion signals to cancel the distortion signals. The feedforward-type linear power amplifier is widely used in a base station of a satellite or mobile communication system. Though the feedforward-type linear power amplifier has an improved efficiency in suppressing the distortion signals compared to the other types of the linear power amplifiers, it requires a large capacity and is complex in structure, thereby causing increased power loss.

FIG. 1 illustrates a block diagram of a general feedforward-type linear power amplifier, in which the amplifier extracts only intermodulation distortion signals from the output thereof and combines the intermodulation distortion signals with the output signals in opposite phase, thereby improving a C/I (Carrier to Intermodulation) ratio.

Referring to FIG. 1, a power divider 111 divides the RF input signal, and outputs the divided RF signals through a main path and a sub path. The power divider 111 may include a directional coupler. A main power amplifier 112 amplifies the divided RF signal received from the power divider 111 via the main path. A second delay line 121 receives the RF signal output from the main power amplifier 112 to delay the RF signal for an error amplification time.

A first delay line 114 delays the divided RF signal on the sub path, while the main power amplifier 112 amplifies the divided RF signal on the main path. A first variable attenuator 115 attenuates a magnitude of the RF signal on the sub path received through the first delay line 114. A first variable phase shifter 116 receives an output of the first variable attenuator 115, to control phase of the attenuated RF signal.

A power divider 113 is connected to an output end of the main power amplifier 112 to divide the output of the main power amplifier 112. The power divider 113 may include a directional coupler. A signal canceler 117 cancels the non-amplified RF signal on the sub path from the amplified RF signal output of the main power amplifier 112, so as to detect only the intermodulation signals generated during amplification of the RF signal.

A second variable attenuator 118 receives the intermodulation signals detected by the first signal canceler 117 to control a magnitude of the intermodulation signals. A second variable phase shifter 119 receives the intermodulation signals from the second variable attenuator 118 to control phase of the intermodulation signals. An error amplifier 120 amplifies the intermodulation signals from the second variable phase shifter 119. A power combiner 122 combines an output of the error amplifier 120 with an output of the second delay line 121. The power combiner 122 may include a directional coupler.

FIGS. 2A through 2E illustrate characteristics of signals generated at each part of the linear power amplifier of FIG. 1 in a case where two tones are applied thereto. Specifically, FIG. 2A shows the RF input signal, FIG. 2B the RF signal amplified by the main power amplifier 112, FIG. 2C the intermodulation signal extracted by canceling the RF input signal of FIG. 2A from the amplified RF signal of FIG. 2B, FIG. 2D the amplitude-controlled signals having an opposite phase to that of the intermodulation signals of FIG. 2C, and FIG. 2E a final output signal with the intermodulation signal being suppressed by combining the RF signal of FIG. 2B with the extracted intermodulation signal of FIG. 2D.

Referring to FIGS. 1 through 2E, operation of the feedforward-type linear power amplifier will be described hereinbelow. The RF input signal is divided by the power divider 111 and applied to a node NA of the main path and a node NA' of the sub path. Here, the divided RF signals have the same magnitude and phase, as shown in FIG. 2A. The input signal on the main path is amplified by the main power amplifier 112. The output signal of the main power amplifier 112 includes the intermodulation distortion signals with the amplified RF signals, as shown in FIG. 2B. The signal canceler 117 cancels the RF input signal of FIG. 2A from the signal of FIG. 2B, to detect the intermodulation signals as shown in FIG. 2C.

The variable attenuator 118 attenuates the intermodulation distortion signals from the signal canceler 117 so as to make the output signal levels coincide with the intermodulation distortion signals amplified by the main power amplifier 112. The variable phase shifter 119 inverts the intermodulation signals by 180°. Accordingly, as shown in FIG. 2D, the intermodulation signals generated from the variable phase shifter 119 have an opposite phase to the intermodulation signals contained in the output of the main power amplifier 112. The error amplifier 120 amplifies the intermodulation signals of FIG. 2D, and the second delay line 121 delays the amplified signal of FIG. 2B on the main path, so that the delayed signal and the output of the error amplifier 120 reach the power combiner 122 concurrently. The power combiner 122 combines the intermodulation signals contained in the amplified signal of FIG. 2B from the second delay line 121 with the inverted intermodulation signals of FIG. 2D to cancel the intermodulation signals, thereby generating the final output signal as shown in FIG. 2E.

An output level of the RF amplifier for use in a base station of a mobile communication system or a personal communication system (PCS) varies, as a subscriber uses the system. With the variation of the output level, the input signal level applied to the RF amplifier is also varied, which results in a change of the characteristics of the intermodulation distortion signals generated from the RF amplifier. Accordingly, the variable attenuators 115 and 118, and the variable phase shifters 116 and 119 connected to the input and output ends of the signal canceler 117 should be continuously readjusted to optimize the linear characteristics. Furthermore, though the input level of the RF amplifier is maintained at a constant level, the output characteristic is changed according to the operational condition of the RF amplifier. Therefore, the variable attenuators 115 and 118 and the variable phase shifters 116 and 119 should be continuously readjusted to optimize the linear characteristics.

A conventional method for controlling the variable attenuators 115 and 118 and the variable phase shifters 115 and 119 is to apply a pilot tone to a pre-stage of the power divider 111 and input/output ends of the RF amplifier to detect the pilot tone at the output ends of the signal canceler 117 and the power combiner 122. However, in the case of using such a pilot tone, the RF amplifier has a decreased output power and needs various supplemental devices. Thus, the RF amplifier becomes complex in structure, and cannot control the attenuation and phase of the signal in real time.

Furthermore, in the case of using a digital signal processor, it is possible to extract, search and analyze the input signal and intermodulation distortion signals at the input end of the power divider 111, the output ends of the signal canceler 117 and the power combiner 122, and according to the analysis, control the variable attenuators 115 and 118 and the variable phase shifters 116 and 119. However, in this case, since the RF amplifier also needs various additional devices, the system becomes complex in structure and cannot control the variable attenuators 115 and 118 and the variable phase shifters 116 and 119 in real time.

SUMMARY OF THE INVENTION

It is therefore an object of the present invention to provide a feedforward-type linear power amplifier for linearly amplifying an RF input signal in real time.

It is another object of the present invention to provide a feedforward-type linear power amplifier including an average power detector for detecting an average power of input signals and a phase detector for detecting a relative phase between the input signals.

It is still another object of the present invention to provide a feedforward-type linear power amplifier for directly comparing amplitude and phase of a signal applied to one input end of a signal canceler with amplitude and phase of a signal applied to another input end of the signal canceler, to control attenuation and phase of the input signal.

It is yet another object of the present invention to provide a feedforward-type linear power amplifier for directly comparing an intermodulation distortion signal on a main path with an intermodulation signal generated from a signal canceler to cancel the intermodulation signal.

To achieve the above objects, there is provided a feedforward-type linear power amplifier including a power amplifier for amplifying an RF input signal. The linear power amplifier includes a first attenuation/phase controller for comparing amplitude and phase of the amplified signal with amplitude and phase of the RF input signal to control the amplitude and phase of the RF input signal; a first signal canceler for canceling the signal whose amplitude and phase are controlled by the first attenuation/phase controller, from the amplified signal, so as to extract intermodulation distortion signals from the amplified signal; a second attenuation/phase controller for comparing amplitude and phase of the amplified signal with amplitude and phase of the RF input signal, to control the amplitude and phase of the RF input signal, the amplified signal and the RF input signal being delayed respectively by first and second delay lines; a second signal canceler for canceling the signal whose amplitude and phase are controlled by the second attenuation/ phase controller, from the amplified delay signal, so as to extract intermodulation distortion signals from the amplified delay signal; a third attenuation/phase controller for comparing amplitude and phase of an output signal of the second signal canceler with amplitude and phase of an output signal of an error amplifier, to control the amplitude and phase of the extracted intermodulation distortion signal; and a device including an error amplifier, for amplifying the intermodulation distortion signal whose amplitude and phase are controlled by the third attenuation/phase controller, and combining the amplified intermodulation distortion signal with the amplified signal to cancel the intermodulation distortion signals contained in the amplified signal.

BRIEF DESCRIPTION OF THE DRAWINGS

The above objects and other advantages of the present invention will become more apparent by describing the preferred embodiments of the present invention with reference to the attached drawings, in which:

FIGS. 2A through 2E are diagrams explaining operating principals of the feedforward-type linear power amplifier of FIG. 1;

DETAILED DESCRIPTION OF PREFERRED EMBODIMENTS

Preferred embodiments of the present invention will be described in detail hereinbelow with reference to the accompanying drawings. For comprehensive understanding of the present invention, the present invention will be illustratively described, confined to a specific embodiment. However, it should be noted that the present invention can be implemented by one skilled in the art with the present disclosure. In the following description, well-known functions or constructions which may obscure the present invention in unnecessary detail are not described in detail.

Figure 1:
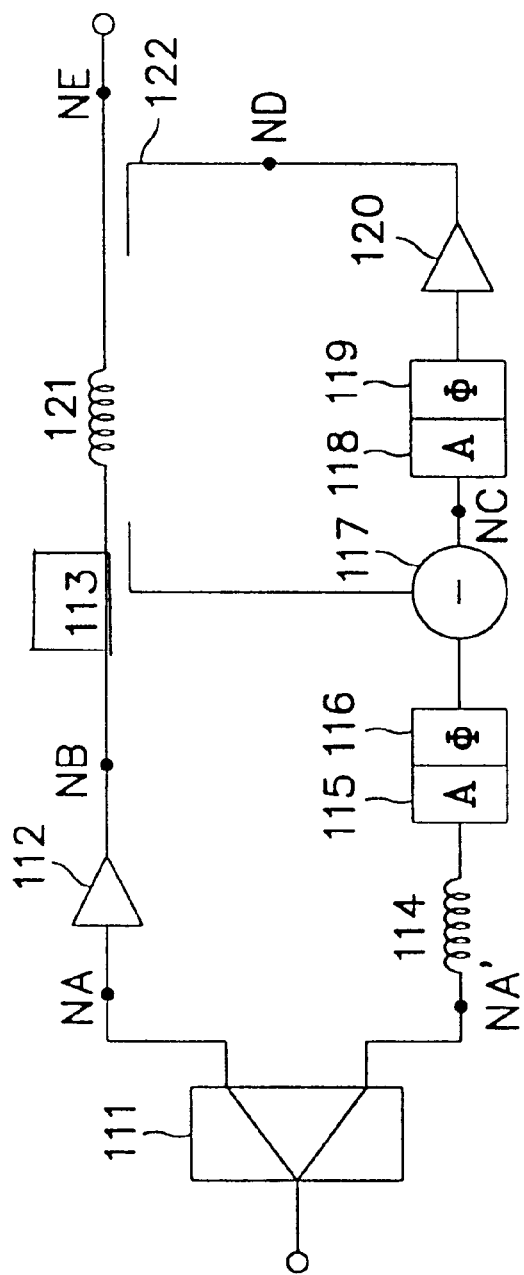
FIG. 1 is a block diagram of a conventional feedforward-type linear power amplifier.
Figure 3:
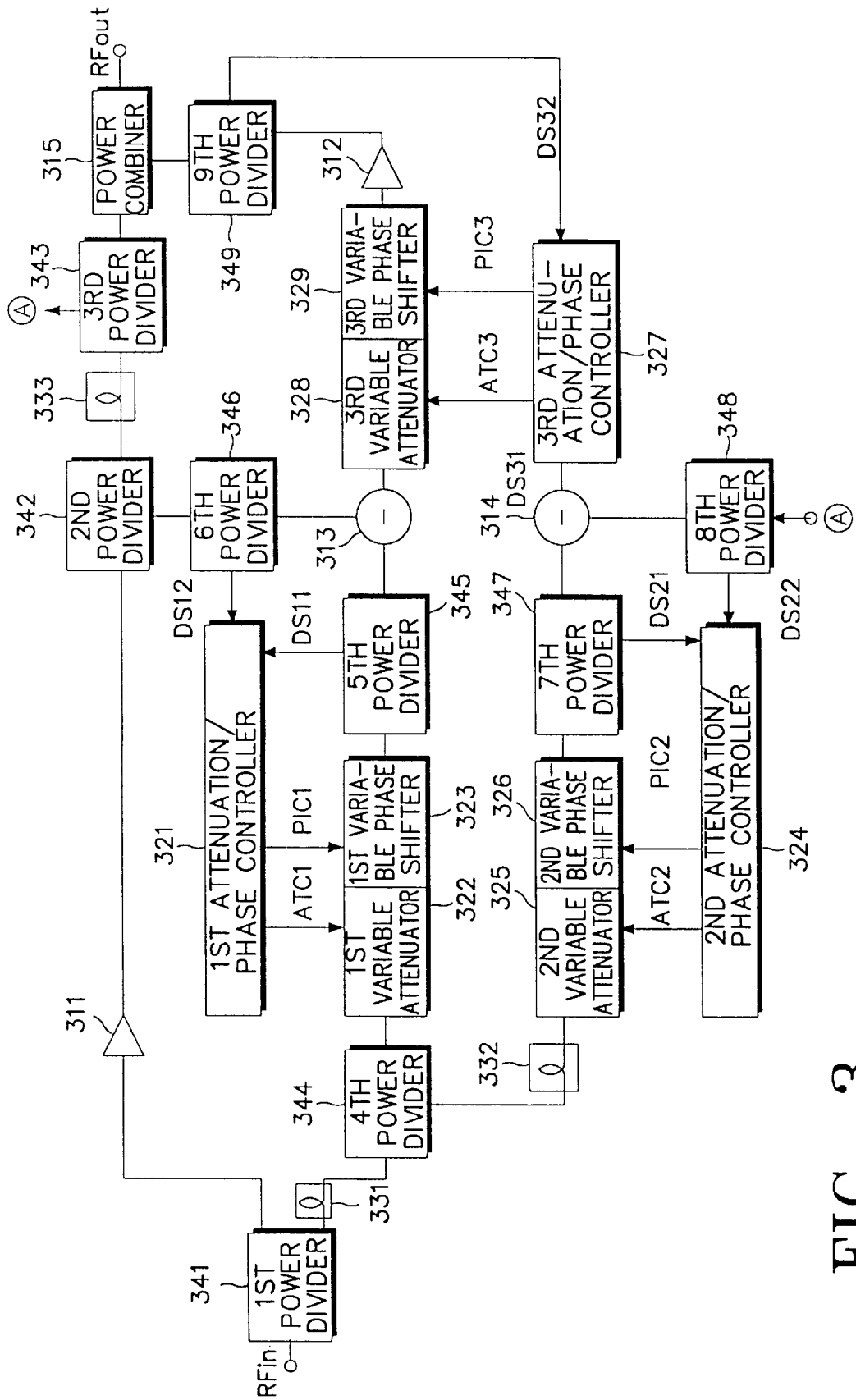
FIG. 3 is a block diagram of a feedforward-type linear power amplifier according to a preferred embodiment of the present invention.

FIG. 3 illustrates a block diagram of a feedforward-type linear power amplifier according to a preferred embodiment of the present invention. As illustrated, a first power divider 341 divides an RF input signal RFin, and a main power amplifier 311 amplifies the divided RF input signal from the power divider 341. The output signal of the main power amplifier 311 includes intermodulation signals generated in the process of amplification. To remove the intermodulation signals, the linear power amplifier according to the present invention directly compares amplitude and phase of a signal applied to one input end of a first signal canceler 313 with amplitude and phase of a signal applied to another input end of the first signal canceler 313, to control a variable attenuator 322 and a variable phase shifter 323 situated in a pre-stage of the first signal canceler 313. Thereafter, when combining the intermodulation distortion signals generated from the first signal canceler 313 with the amplified RF signal on the main path, the linear power amplifier directly compares amplitude and phase of the amplified RF signal on the main path with amplitude and phase of the intermodulation distortion signals, to cancel the intermodulation distortion signals.

First, a detailed description will be made of an operation of directly comparing two input signals applied to the first signal canceler 313 to control attenuation and phase of the RF input signal.

A first delay line 331 delays the divided RF signal on the sub path, while the main power amplifier 311 amplifies the divided RF signal on the main path. A fourth power divider 344 divides the delayed signal from the first delay line 331. A first variable attenuator 322 attenuates amplitude of the divided output signal from the fourth power divider 344 according to a first attenuation control signal ATC1. A first variable phase shifter 323 shifts a phase of the attenuated signal from the first variable attenuator 322 according to a first phase control signal PIC1. A fifth power divider 345 divides an output signal of the first variable phase shifter 323, and applies a divided output signal DS11 to a first attenuation/phase controller 321 and another divided output signal to an input end of the first signal canceler 313.

Further, a second power divider 342 divides the amplified signal output from the main power amplifier 311. A sixth power divider 346 divides an output signal of the second power divider 342, and applies one of the divided output signals to the first signal canceler 313 and another divided output signal DS12 to the first attenuation/phase controller 321.

The first attenuation/phase controller 321 directly compares the amplified RF signal DS12 from the main power amplifier 311 with the RF signal DS11, to generate the first attenuation control signal ATC1 and the first phase control signal PIC1 for controlling the amplitude and phase of the RF input signal such that the first signal canceler 313 extracts the pure intermodulation signal. The first signal canceler 313 cancels the output signal of the fifth power divider 345 from the amplified output signal of the sixth power divider 346 to extract the intermodulation signal included in the amplified signal. The first signal canceler 313 may include a subtracter.

Next, a detailed description will be made for a construction for directly comparing the amplitude and phase of the intermodulation signal detected by the first signal canceler 313 with amplitude and phase of the intermodulation signal included in the amplified signal on the main path.

A second delay line 332 delays an output signal of the fourth power divider 344, and a second variable attenuator 325 attenuates amplitude of the delayed signal output from the second delay line 332 according to a second attenuation control signal ATC2. A second variable phase shifter 326 shifts phase of the attenuated signal output from the second variable attenuator 325 according to a second phase control signal PIC2. A seventh power divider 347 divides an output signal of the second phase shifter 326, and applies a divided output signal DS21 to a second attenuation/phase controller 324 and another divided output signal to a second signal canceler 314.

A third delay line 333 delays the amplified signal from the second power divider 342, while an error amplifier 312 amplifies the intermodulation signal. A third power divider 343 divides the delayed signal output from the third delay line 333 and applies one of the divided signals to a power combiner 315 and another divided output signal to an eighth power divider 348. The eighth power divider 348 divides the divided output signal of the third power divider 343, and applies a divided output signal to the second signal canceler 314 and another divided output signal DS22 to the second attenuation/phase controller 324.

The second attenuation/phase controller 324 directly compares the amplified signal DS22 from the eighth power divider 348 with the signal DS21 from the seventh power divider 347, to generate the second attenuation control signal ATC2 and the second phase control signal PIC2 for controlling the amplitude and phase of the input signal such that the second signal canceler 314 extracts the pure intermodulation signal. The second signal canceler 314 cancels the output signal of the seventh power divider 347 from the amplified signal of the eighth power divider 348 to detect the intermodulation signal included in the amplified signal. The second signal canceler 314 may include a subtracter.

A third variable attenuator 328 attenuates the amplitude of the intermodulation distortion signal from the first signal canceler 313 according to a third attenuation control signal ATC3. A third variable phase shifter 329 shifts phase of the attenuated intermodulation distortion signal output from the third variable attenuator 328 according to a third phase control signal PIC3. The error amplifier 312 amplifies the phase-shifted intermodulation signal output from the third variable phase shifter 329. A ninth power divider 349 divides the amplified intermodulation signal output from the error amplifier 312, and applies a divided output signal to the power combiner 315 and another divided output signal DS32 to a third attenuation/phase controller 327. The third attenuation/phase controller 327 compares the signal DS31 from the second signal canceler 314 with the signal DS32 from the ninth power divider 349, to generate the third attenuation control signal ATC3 and the third phase control signal PIC3.

As described above, the linear power amplifier according to the present invention directly compares the amplitude and phase of the intermodulation distortion signal on the main path with the amplitude and phase of the extracted intermodulation signal output from the first signal canceler 313, in order to cancel the intermodulation signal included in the output signal of the main power amplifier 311 by combining the inverted intermodulation signal on the sub path with the intermodulation signal on the main path by means of the power combiner 315.

In the feedforward-type linear power amplifier of FIG. 3, the power dividers 341–349 each divides the input signal and generates the divided output signals through two output ends. The power combiner 315 combines the signals received at two input ends thereof, and the main power amplifier 311 amplifies the RF input signal. The variable attenuators 322, 325 and 328 each attenuates the amplitude of the input signal, and the variable phase shifters 323, 326 and 329 each shifts the phase of the input signal. Further, the signal cancelers 313 and 314 each cancels the signals having the opposite phase, applied to two input ends thereof. The error amplifier 312 amplifies the intermodulation distortion signal extracted by the first signal canceler 313. The attenuation/phase controllers 321, 324 and 327 each compares the amplitude and phase of the signal applied to one input end with the amplitude and phase of the signal applied to another input end to generate the attenuation control signal ATC, and the phase control signal PIC, both in the form of, for example, a DC voltage, and the delay lines 331–333 each delays the RF signal to compensate for the transfer time thereof.

Figure 13:
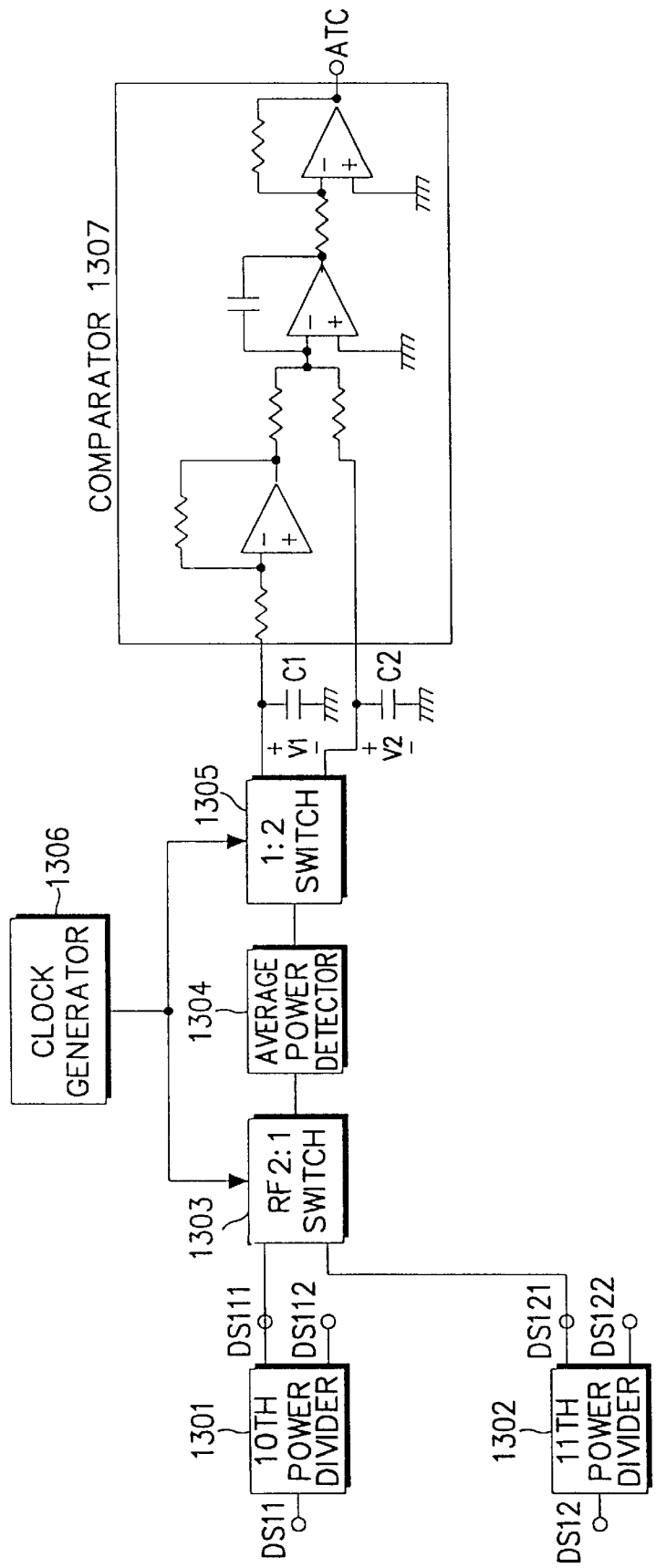
FIG. 13 is a detailed block diagram of an attenuation controller of an attenuation/phase controller of FIG. 3 according to the present invention.
Figure 14:
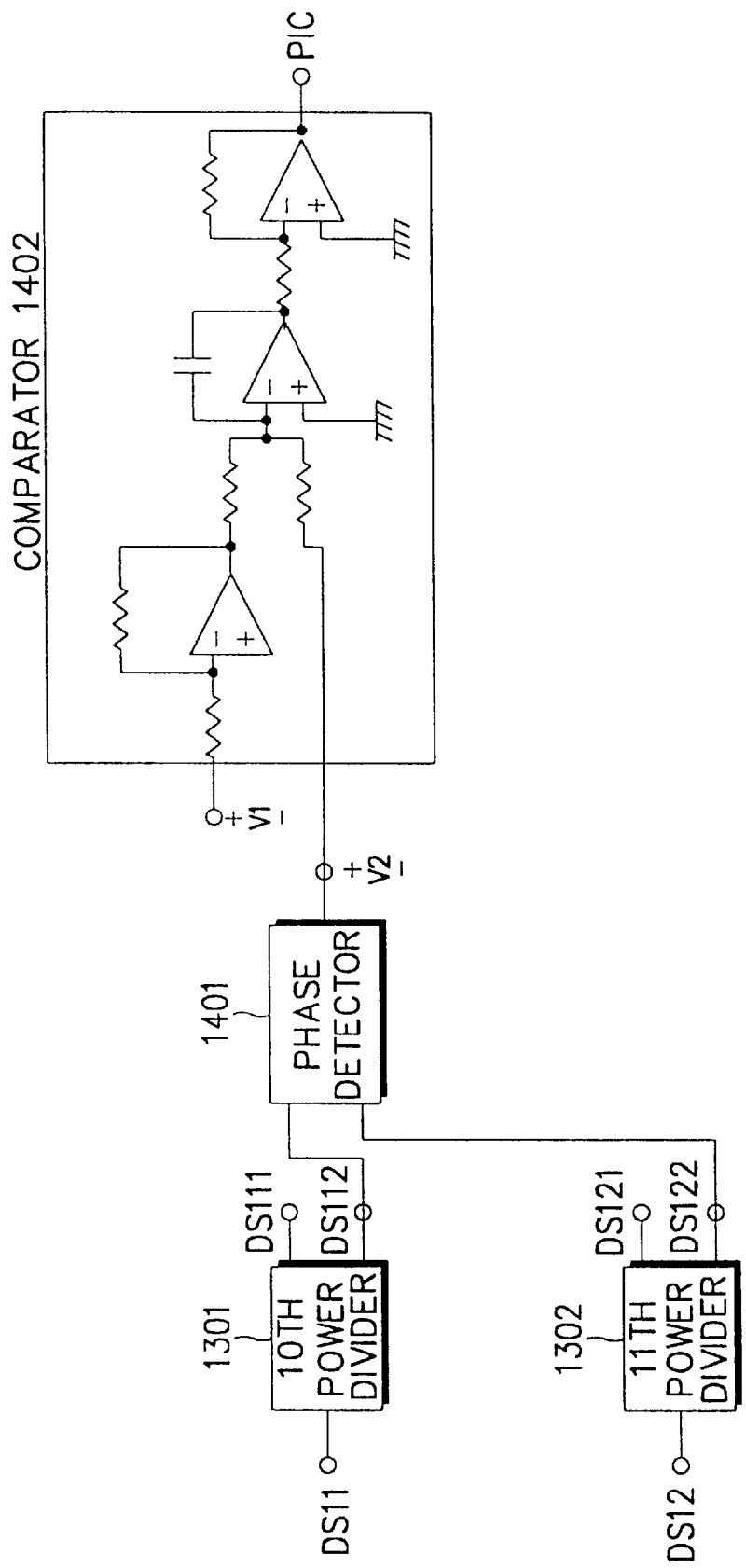
FIG. 14 is a detailed block diagram of a phase controller of the attenuation/phase controller of FIG. 3 according to the present invention.

In the feedforward-type linear power amplifier of FIG. 3, the attenuation/phase controllers 321, 324 and 327 include an attenuation controller shown in FIG. 13 and a phase controller shown in FIG. 14, respectively.

FIG. 13 illustrates a block diagram of the attenuation controller. With reference to the drawing, tenth and eleventh power dividers 1301 and 1302 divide the input signals DS11 and DS12, respectively. A first switch 1303, for example, an RF 2:1 switch, switches in turns, the divided signals, and an average power detector 1304 detects an average power of an output signal of the first switch 1303. A second switch 1305, for example, a 1:2 switch, switches an output signal of the average power detector 1304, and a clock generator generates switching control signals to the first and second switches 1303 and 1305. A comparator 1307 compares an output signal V1 with an output signal V2 of the second switch 1305, to generate the attenuation control signal ATC. For the convenience of explanation, it is assumed in the specification that the attenuation controller shown in FIG. 13 is the attenuation controller prepared in the first attenuation/phase controller 321.

In FIG. 13, the input signal DS11 is the RF input signal, and the input signal DS12 is the amplified RF input signal. The signal DS12 is a signal including the intermodulation distortion signals due to the nonlinear characteristics of the main power amplifier 311. The input signals DS11 and DS12 on the different paths are applied to the tenth and eleventh power dividers 1301 and 1302 at the same time.

The input signal DS11 is divided into signals DS111 and DS112 by the tenth power divider 1301, and the input signal DS12 is divided into signals DS121 and DS122 by the eleventh power divider 1302. The RF 2:1 switch 1303 switches the divided signals DS111 and DS121 according to the switching clock generated from a clock generator 1306, so as to output one of the two divided signals DS111 and DS121 for a first half cycle of the switching clock and another divided signal for a second half cycle of the switching clock. An output signal of the RF 2:1 switch 1303 is converted into a DC voltage by the average power detector 1304. The 1:2 switch 1305 charges a capacitor C1 with the DC output voltage of the average power detector 1304 for the first half cycle of the switching clock and charges a capacitor C2 with the DC output voltage of the average power detector 1304 for the second half cycle of the switching clock. The comparator 1307 compares a voltage V1 charged in the capacitor C1 with a voltage V2 charged in the capacitor C2, to generate the attenuation control signal ATC. Herein, the comparator 1307 generates a negative (−) DC voltage if the voltage V2 is lower than the voltage V1, and a positive (+) DC voltage if the voltage V2 is higher than the voltage V1.

The first variable attenuator 322 increases or decreases attenuation of the RF input signal received from the fourth power divider 344 according to the attenuation control signal ATC1 generated from the comparator 1307. That is, the variable attenuator 322 increases attenuation of the RF input signal in response to the positive (+) DC voltage from the comparator 1307, and decreases attenuation of the RF input signal in response to the negative (−) DC voltage, so as to make the voltages V1 and V2 have the same voltage level. In light of the foregoing description, it is noted that the attenuation of the RF input signal is increased, in the case where the RF input signal is higher than the amplified RF signal from the main power amplifier 311. On the contrary, if the RF input signal is lower than the amplified RF input signal from the main power amplifier 311, the attenuation of the RF input signal is decreased.

The average power detector 1304 can detect an average power of the input signals in real time, regardless of the number of the input signals. In general, a power detector converts the entire or part of the RF signals into a DC voltage, to detect a power level of the RF signals. Such power detector is commonly embodied by using a microwave frequency diode. Here, the diode can be considered as a nonlinear resistor, and an I-V characteristic of the diode can be expressed by the following Equation (1):

$$I(V) = I_S(e^{\alpha v} - 1) \qquad (1)$$

In Equation (1) $\alpha = q/nkT$, where q represents charge of electron, n ideality factor, k Boltzmann's constant, and T absolute temperature.

Figure 4:
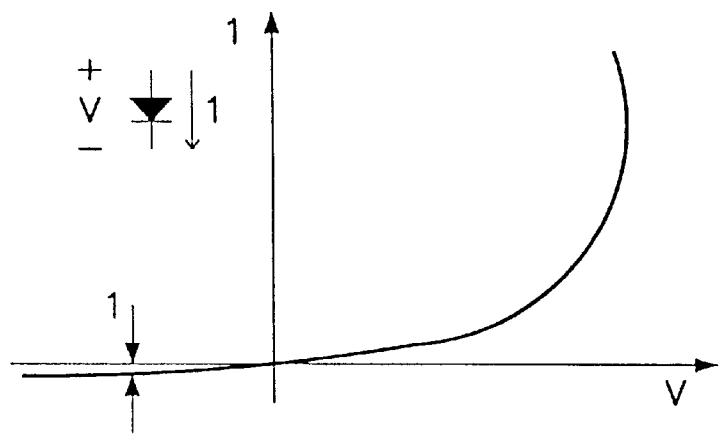
FIG. 4 is a diagram showing a voltage-current characteristic curve of a diode.

FIG. 4 illustrates a DC I-V characteristic curve of a general diode. If a voltage of the following Equation (2) is applied to a diode having the characteristic of FIG. 4, Equation (1) can be rewritten as shown in the following Equation (3) based on a Taylor series.

$$V = V_O + v \qquad (2)$$

where $V_O$ represents DC bias voltage, and v represents AC signal voltage.

$$I(V) = I_O + v \frac{dI}{dV}\bigg|_{V_O} + \frac{1}{2}v^2 \frac{d^2 I}{dV^2} + \cdots \qquad (3)$$

where $I_O = I(V_O)$ which represents DC bias current.

In Equation (3), a simple differential equation can be expressed as shown in the following Equation (4), and a quadratic differential equation can be expressed as shown in the following Equation (5).

$$\frac{dI}{dV}\bigg|_{V_O} = \alpha I_S e^{\alpha V_O} = \alpha(I_O + I_S) = G_d = \frac{1}{R_j} \qquad (4)$$

where $R_j$ represents junction resistance, and $G_d$ dynamic conductance.

$$\left.\frac{d^2 I}{dV^2}\right|V_O = \left.\frac{dG_d}{dV}\right|_{V_O} = a^2(I_O + I_S) = aG_d \quad (5)$$

Equation (3) can be rewritten as shown in the following Equation (6) in terms of the DC current and AC current, by using Equations (4) and (5).

$$I(V) = I_O + i = I_O + vG_d + \frac{v^2}{2}G_d \quad (6)$$

If the DC voltage and the small signal RF voltage as shown in the following Equation (7) are applied to the equation, Equation (6) can be rewritten as shown in the following Equation (8).

$$V = V_O + v_O\cos\omega_O t \quad (7)$$

$$I = I_O + v_O G_d \cos\omega_O t + \frac{v_O^2}{2}G_d \cos^2\omega_O t \quad (8)$$

$$= I_O + \frac{v_O^2}{4}G_d + v_O G_d \cos\omega_O t + \frac{v_O^2}{2}G_d \cos 2\omega_O t$$

It can be appreciated from Equation (8) that the DC output current includes the bias current component and in addition thereto, a component which is in proportion to a square of the RF signal. Thus, the DC output current is in proportion to the input power.

Figure 5:
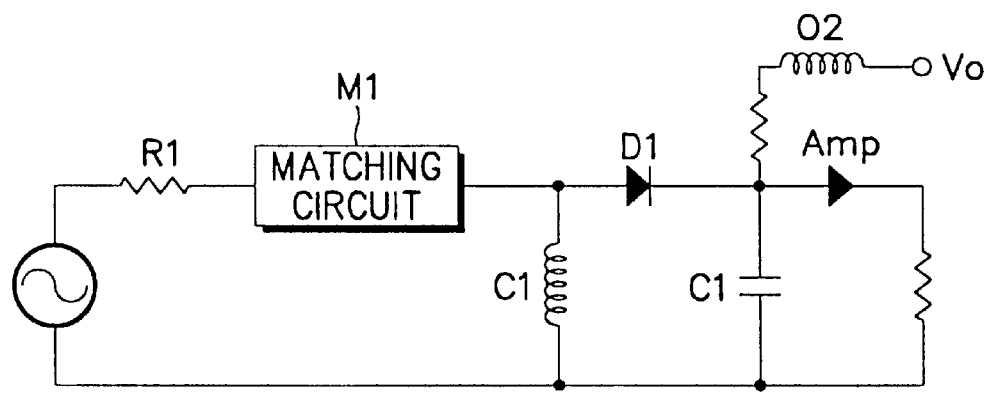
FIG. 5 is a diagram showing a power detector with one nonlinear diode according to the prior art.
Figure 6:
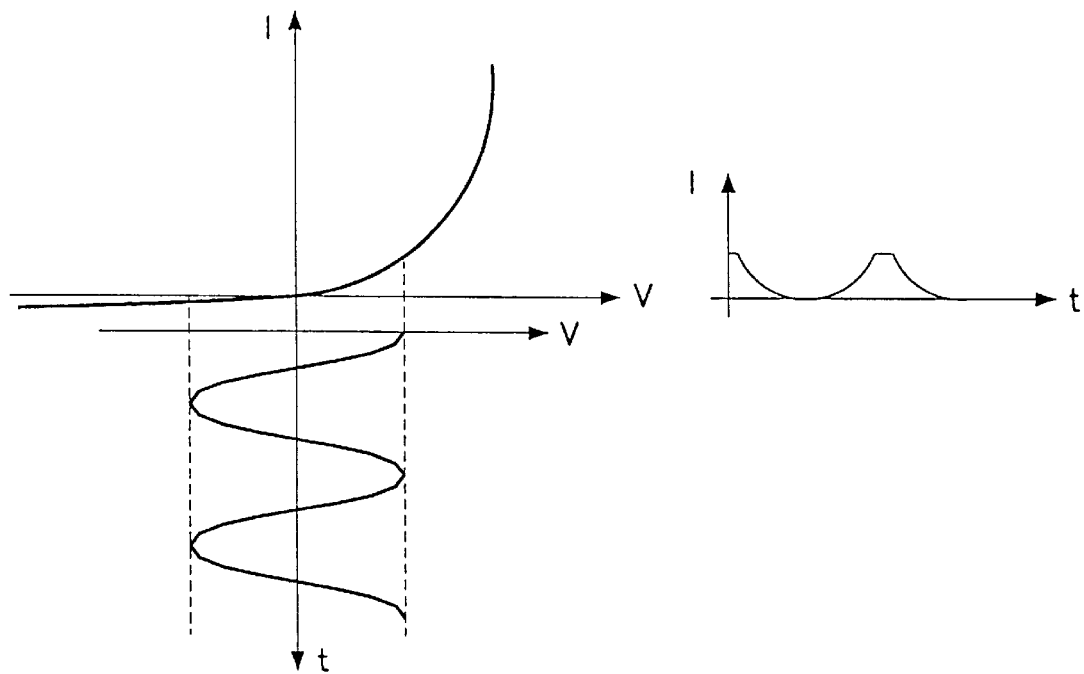
FIG. 6 is a diagram showing an input-output characteristic of the power detector with one diode according to the prior art.

FIG. 5 shows a block diagram of the power detector with a single nonlinear diode according to the prior art, and FIG. 6 shows an input-output characteristic curve of the power detector of FIG. 5.

Referring to FIGS. 5 and 6, if the small signal RF voltage is applied to a diode D1 of FIG. 5, the output current is generated during the half cycle of the input signal, as shown in FIG. 6. This shows that the output current varies according to the peak voltage of the RF input signal. Accordingly, the peak voltage applied to an element varies according to the number of the input signals, though it is a signal having the same average power. Thus, in a system in which the number of tones of the input signals is changed at all times, it is impossible to detect an accurate voltage. Therefore, the power detector of FIG. 5 cannot detect the accurate voltage, in case the signals applied thereto have the different number of the input signals, though having the same average power.

Accordingly, the embodiments of the present invention employ a device capable of detecting an average power of the entire input signals regardless of the number of the input signals, in the case where the number of input signals varies in real time. For this purpose, the average power detector according to the embodiment of the present invention includes two microwave frequency diodes connected back-to-back, to detect an average power of the RF input signals.

Figure 7:
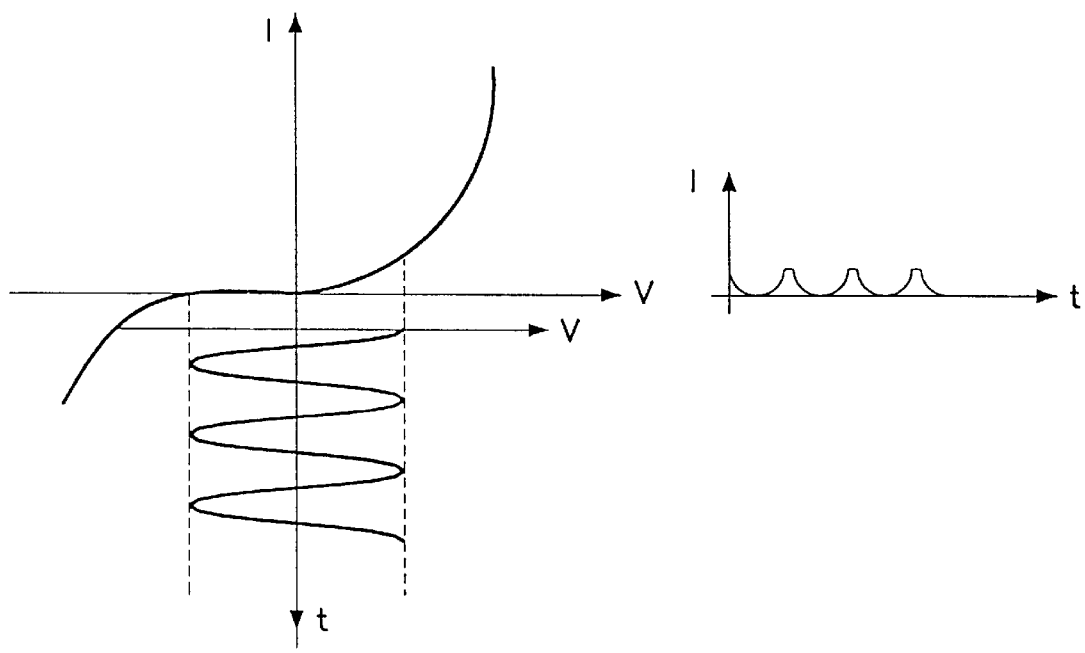
FIG. 7 is a diagram showing an input-output characteristic of an average power detector with two ultrahigh frequency diodes connected back-to-back according to the present invention.

FIG. 7 shows an input-output characteristic curve of the average power detector with the two microwave frequency diodes connected back-to-back. If the small signal RF voltage is applied to the two microwave frequency diodes, the output current is generated for the entire cycle of the input signals, as illustrated in FIG. 7. Therefore, it is possible to obtain a current characteristic which is in proportion to the entire input signal voltages, regardless of the number of the input signals. This implies that if the average power of the input signals is constant, the power detector can detect the same voltage regardless of the number of the input signals.

Figure 8:
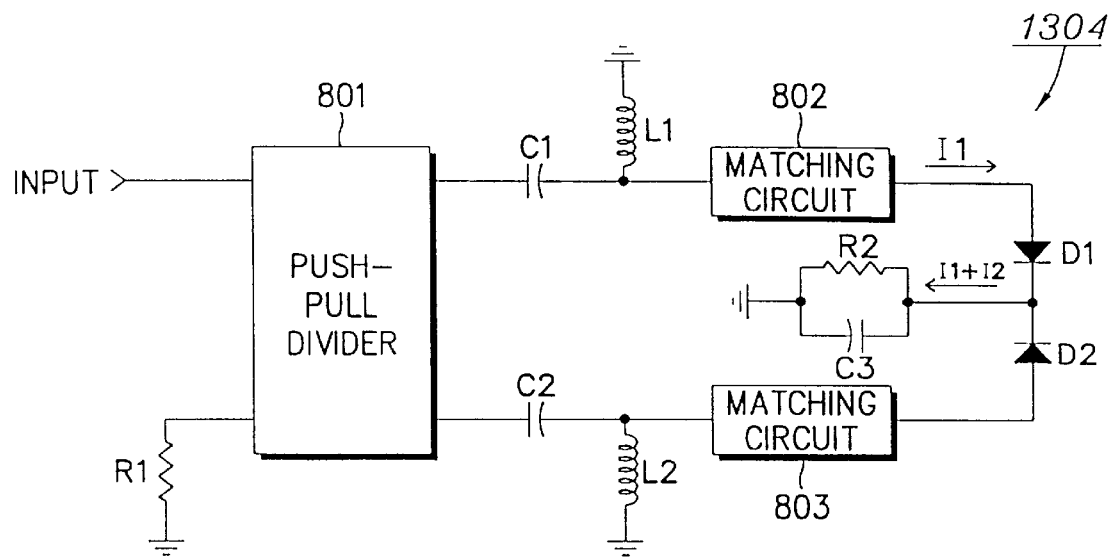
FIG. 8 is a circuit diagram of an average power detector according to a first embodiment of the present invention.

FIG. 8 shows a block diagram of the average power detector 1304 according to a first embodiment of the present invention. In the drawing, a push-pull divider 801, a four-port element (having four input/output ends), divides the RF input signal into signals having opposite phases. A matching circuit 802 is connected between a first output end of the push-pull divider 801 and a first diode D1, to match a characteristic impedance of the first diode D1 with an output characteristic impedance of the push-pull divider 801, at the operating frequency. A matching circuit 803 is connected between a second output end of the push-pull divider 801 and a second diode D2, to match a characteristic impedance of the second diode D2 with an output characteristic impedance of the push-pull divider 801, at the operating frequency. The first and second diodes include a microwave frequency diode for converting the RF input signals received through the matching circuits 802 and 803 into DC currents, respectively. That is, the first and second diodes D1 and D2 rectify the divided RF signals having opposite phases, respectively. A resistor R2 and a capacitor C3 connected in parallel between the ground and a node of cathodes of the first and second diodes D1 and D2, generate a voltage corresponding to the average power. The capacitor C3 charges and discharges the signal currents rectified by the diodes D1 and D2, to detect the voltage value corresponding to the average power. Capacitors C1 and C2 connected respectively between the first and second output ends of the push-pull divider 801 and the matching circuits 802 and 803 are blocking capacitors for separating the RF signal from the DC current rectified by the first and second diodes D1 and D2. Furthermore, junction inductors L1 and L2 connected to ground respectively between the blocking capacitors C1 and C2 and the matching circuits 802 and 803, form paths for the DC currents generated from the corresponding microwave frequency diodes D1 and D2.

Referring to FIG. 8, operation of the average power detector 1304 according to the first embodiment of the present invention will be described hereinbelow. The push-pull divider 801 divides the RF input signal into signals having opposite phases and generates its output signals to the first and second output ends thereof. The push-pull divider 801 has a fixed input end connected to the ground through a resistor R1 of about 50 Ω. The divided RF signals generated from the push-pull divider 801 are applied to the microwave frequency diodes D1 and D2, which are power detection elements, via the matching circuits 802 and 803, respectively. Here, the matching circuits 802 and 803 match the characteristic impedance that the diodes D1 and D2 have at the operating frequency with the output characteristic impedance of the push-pull divider 801. The matching circuits 802 and 803 may include distribution circuits.

When the small signal RF voltage is applied to the ultrahigh frequency diodes D1 and D2, the output current developed by Taylor series can be expressed as shown in the following Equation (9).

$$I_1 = I_S(e^{av} - 1) = \quad (9)$$

$$I_S\left[\left(1 + av + \frac{1}{2!}(av)^2 + \cdots\right) - 1\right] = I_S\left[av + \frac{1}{2}(av)^2 + \cdots\right]$$

$$I_2 = I_S(e^{-av} - 1) = I_S\left[\left(1 - av + \frac{1}{2!}(av)^2 - \cdots\right) - 1\right] =$$

$$I_S\left[-av + \frac{1}{2}(av)^2 + \cdots\right]$$

$$I = I_1 + I_2 = 2I_S\left[\frac{1}{2}(av)^2 + \cdots\right]$$

In Equation (9), DC components derived from even modes of the input signal v are detected by the resistor R2 connected to the diodes D1 and D2, and odd mode signals cancel each other. The blocking capacitors C1 and C2 separate the RF input signals from the DC voltage generated from the microwave frequency diodes D1 and D2. The capacitor C3 adjusts a time constant of the detected current, and the resistor R2 converts the currents detected by the diodes D1 and D2 into a voltage value, adjusting the time constant together with the capacitor C3. Further, the inductors L1 and L2 form the DC paths.

Figure 9:
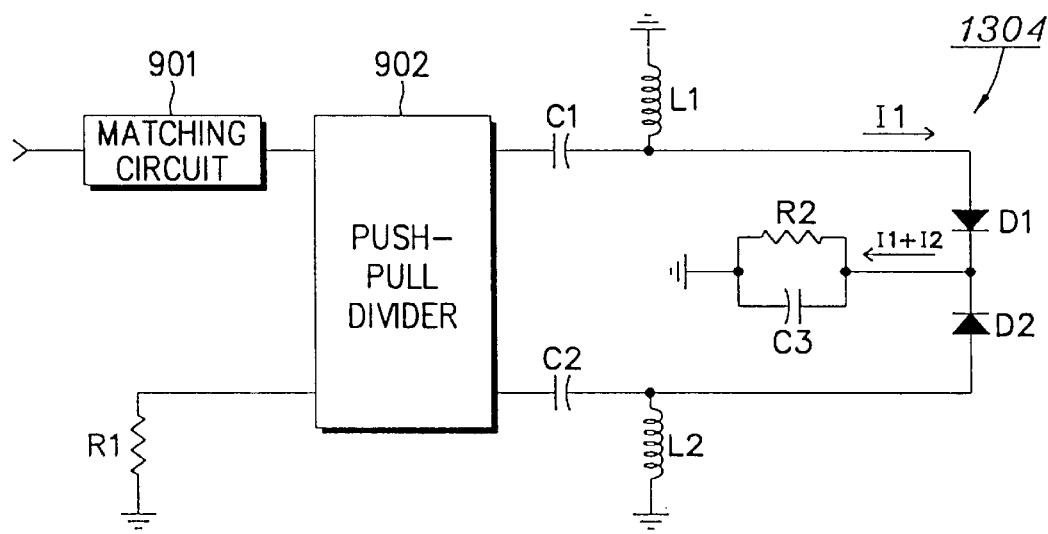
FIG. 9 is a circuit diagram of an average power detector according to a second embodiment of the present invention.

FIG. 9 shows a block diagram of the average power detector 1304 according to a second embodiment of the present invention. In the drawing, a matching circuit 901 is disposed at an input end of the average power detector 1304 to match an input characteristic impedance of a push-pull divider 902 with a characteristic impedance of about 50 Ω. The push-pull divider 902 divides the RF input signal into signals having opposite phases, and outputs the divided RF signals to its two output ends. The push-pull divider 902 is a two-port element having four-input/output ends.

Anodes of the first and second diodes D1 and D2 are respectively connected to the first and second output ends of the push-pull divider 902, and cathodes of the first and second diodes D1 and D2 are connected in common to the output end of the average power detector 1304. The first and second diodes D1 and D2 are the microwave frequency diodes, and convert the divided RF signals from the push-pull divider 902 into DC currents. That is, the first and second diodes D1 and D2 rectify the divided RF signal having the opposite phases. The resistor R2 and the capacitor C3 commonly connected in parallel to the cathodes of the first and second diodes D1 and D2, generate the average power. The capacitor C3 charges and discharges the signal currents rectified by the diodes D1 and D2 to detect the voltage value corresponding to the average power. The capacitors C1 and C2 connected respectively between the diodes D1 and D2 and the output ends of the push-pull divider 902 are the blocking capacitors for separating the RF signals from the DC current output of the microwave frequency diodes D1 and D2. Further, the junction inductors L1 and L2 form paths for the DC currents generated from the microwave frequency diodes D1 and D2.

Next, referring to FIG. 14, the phase controller prepared in the attenuation/phase controllers 321, 324 and 327 will be described in detail. As illustrated, the tenth power divider 1301 divides the input signal DS11 into the signals DS111 and DS112, and the eleventh power divider 1302 divides the input signal DS12 into the signals DS121 and DS122. A phase detector 1401 receives the signals DS112 and DS122 to generate a voltage V2. A comparator 1402 compares the output voltage V2 of the phase detector 1401 with a reference voltage V1, to generate the phase control signal PIC. Here, the reference voltage V1 corresponds to a relative reference phase of the two input signals DS112 and DS122. Specifically, the comparator 1402 generates a negative (−) DC voltage if the voltage V2 is lower than the reference voltage V1, and a positive (+) DC voltage if the voltage V2 is higher than the reference voltage V1.

Then, the variable phase shifter 323 shifts phase of the RF signal received from the first variable attenuator 322 according to the DC voltage output from the comparator 1402. That is, the variable phase shifter 323 logs the phase of the RF input signal in response to the positive (+) DC voltage output from the comparator 1402, and have the phase of the RF input signal precede in response to the negative (−) DC voltage output from the comparator 1402, so as to finally converge the voltages V1 and V2 on the same voltage.

The linear power amplifier according to the present invention employs the phase detector 1401 for detecting relative phase difference information. In general, a most widely used element for detecting the relative phase difference information is a diode mixer or a I&Q demodulator. The I&Q demodulator includes two diode mixers combined with each other, and FIG. 10 shows a block diagram of the I&Q demodulator.

Figure 10:
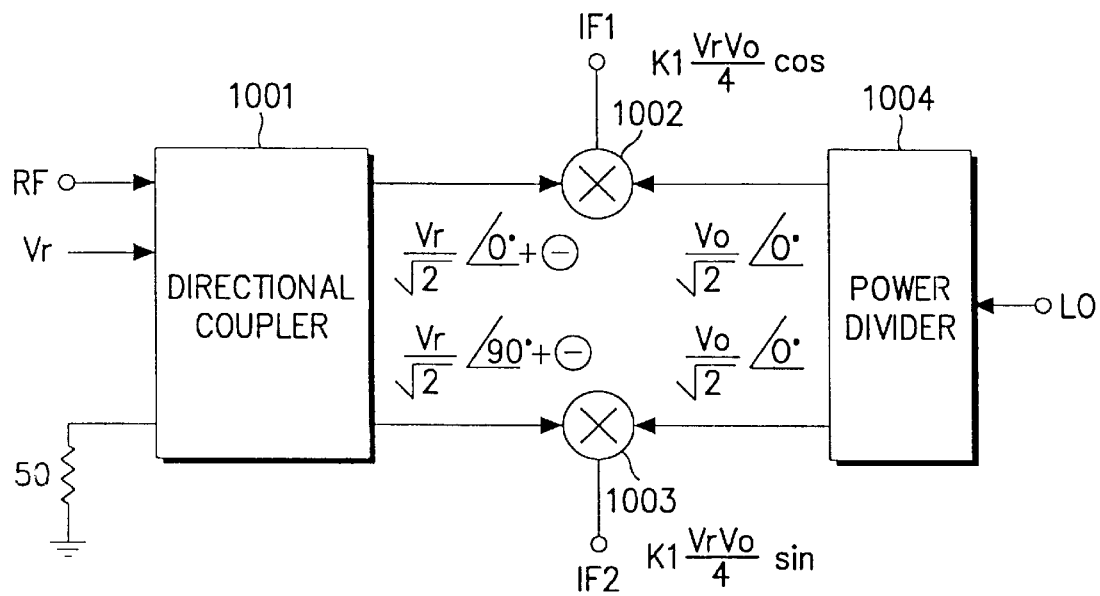
FIG. 10 is a diagram of a phase detector for detecting relative phase difference information according to the prior art.

Referring to FIG. 10, the RF input signal applied to an input end RF is divided into two signals having 90° phase difference by a directional coupler 1001, and the divided signals are applied to mixers 1002 and 1003, respectively. Further, an LO signal applied to an input end LO is divided into two signals having the same phase by an in-phase power divider 1004, and the divided LO signals are applied to the mixers 1002 and 1003, respectively. Developing this in a formula, the mixer 1002 has the RF signal of $[v_r\cos(\omega_0 t + \theta)]/\sqrt{2}$ and the LO signal of $(v_r\cos\omega_0 t)/\sqrt{2}$.

Therefore, an IF (Intermediate Frequency) signal IF1 generated from the mixer 1002 can be expressed as shown the following Equation (10).

$$V_{IF1} = \frac{K_1}{2} v_r v_O \cos(\omega_0 t + \theta)\cos(\omega_0 t) \qquad (10)$$

$$= \frac{K_1}{4} v_r v_O [\cos(2\omega_0 t + \theta) + \cos\theta]$$

If the IF1 signal of Equation (10) is applied to a lowpass filter, the high frequency component is removed and the final IF1 signal output is expressed by the following Equation (11).

$$V_{IF1} = \frac{K_1}{4} v_r v_O \cos\theta \qquad (11)$$

Here, $K_1$ in Equations (10) and (11) includes conversion loss of the mixer 1002. In the same manner, an IF signal IF2 generated from the mixer 1003 can be expressed by the following Equation (12).

$$V_{IF2} = \frac{K_2}{2} v_r v_O \cos(\omega_0 t + \theta - 90°)\cos(\omega_0 t) \qquad (12)$$

$$= \frac{K_2}{4} v_r v_O [\cos(2\omega_0 t + \theta - 90°) + \cos(\theta - 90°)]$$

The signals $V_{IF1}$ and $V_{IF2}$ are applied to the I&Q signal of the I&Q demodulator, to extract the relative phase difference information between RF signals applied to the input ends RF and LO.

However, in case of detecting the phase difference information between the RF signals by using the I&Q demodulator, the linear power amplifier has the following problems. First, the signal power applied to the input end LO of the I&Q demodulator should be 10 dBm. In order to detect the relative phase difference information, the RF signal is divided and applied to the input ends RF and LO of the I&Q demodulator. In this case, if magnitude of the RF signal is relatively lower, the RF signal should be amplified before being applied to the input end LO. It is necessary to maintain the phase information of the RF signal while amplifying and applying the RF signal to the input end LO. To maintain the phase information, a driving amplifier should amplify the signal without generation of phase distortion. Accordingly, a 1 dB compression point of the driving amplifier for the I&Q demodulator should be much higher than 10 dBm, which results in difficulty in manufacturing the phase detector as well as an increase of the manufacturing cost. Second, the I&Q demodulator is expensive and needs many additional devices in controlling the phase information by using the DC voltage at the I and Q terminals. Thus, the phase detector becomes expensive.

Figure 11:
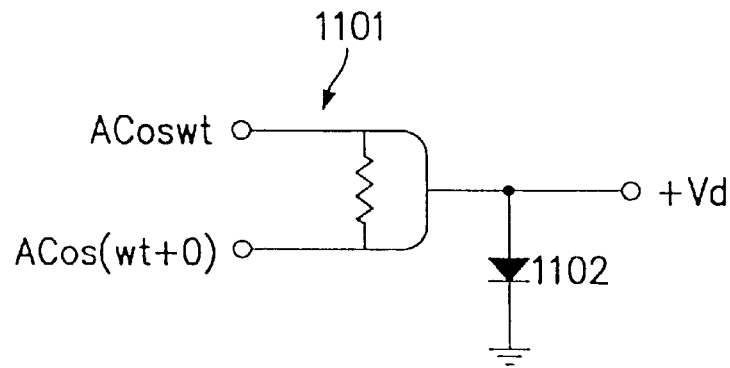
FIG. 11 is a diagram of a phase detector according to a preferred embodiment of the present invention.
Figure 12:
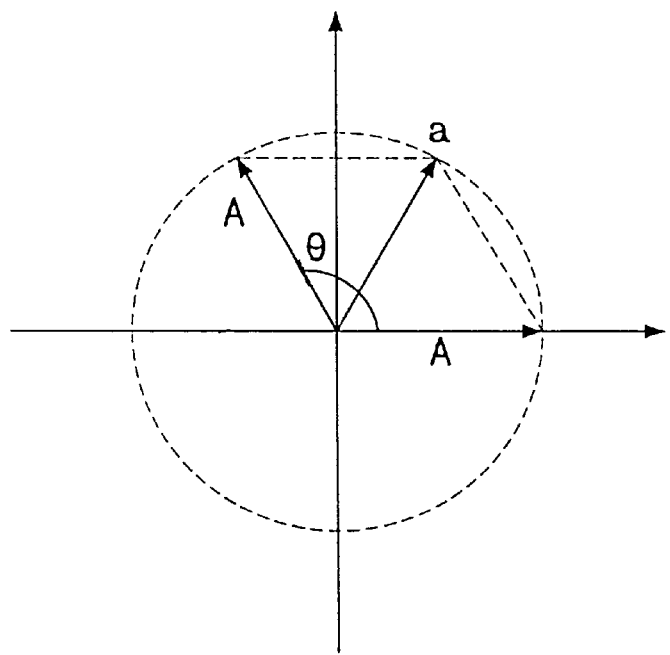
FIG. 12 is a diagram showing a vector synthetic characteristic generated during detection of a phase difference by the phase detector according to the present invention.

FIG. 11 shows the phase detector according to an embodiment of the present invention. As illustrated, the phase detector includes an in-phase power synthesizer 1101 for synthesizing the two RF input signals in the same phase, and an average power detector 1102 connected between an output end of the in-phase power combiner 1101 and the ground, for converting the synthesized RF signal into the DC voltage. FIG. 12 shows a vector synthetic characteristic of the two signals in the phase detector according to the present invention.

Therefore, as illustrated in FIG. 11, the phase detector for detecting the relative phase difference information applies the RF signals, whose relative phase difference information is to be detected, to the two input ends of the in-phase power synthesizer 1101. The in-phase power synthesizer 1101 synthesizes the RF input signals in the same phase. The average power detector 1102 detects the DC voltage of the synthesized signal. In this way, the phase detector can detect the relative phase difference information between the RF input signals.

Referring to FIGS. 11 and 12, if the RF signals having the same frequency component are applied to the two input ends of the in-phase power synthesizer 1101, the RF signals are vector-synthesized at the output ends of the in-phase power synthesizer 1101 as shown in FIG. 12. That is, if the RF signals with the same amplitude applied to the input ends of the in-phase power synthesizer 1101 have the phase difference of 0°, the output signal has an amplitude twice the input signals. However, if the relative phase difference between the RF signals is 180°, the RF signals are canceled out, thus generating no output signal. Accordingly, if the RF input signals with the same amplitude has the relative phase difference θ, the in-phase power synthesizer 1101 generates the vector synthetic output signal.

The average power detector 1102 connected to the output end of the in-phase power synthesizer 1101 converts the vector synthetic RF signal from the in-phase power synthesizer 1101 into the DC voltage. In case of vector-synthesizing the RF signals having the same amplitude, the amplitude of the RF output signal varies according to the change of the relative phase of the RF input signals. Therefore, it is possible to detect the accurate relative phase difference information. It is necessary that the average power detector 1102 should be able to generate the same DC voltage even though the number of the RF input signals applied to the input ends of the in-phase power synthesizer 1101 are over two.

Describing operation of the feedforward-type linear power amplifier having the above structure, the RF input signal is divided by the first power divider 341, and the divided signals are respectively applied to the main power amplifier 311 and the first delay line 331. The main power amplifier 311 amplifies the divided RF input signal, and the amplified RF signal may include the intermodulation distortion signals generated during amplifying the RF input signal. The second power divider 342 divides the amplified RF signal from the main power amplifier 311, and applies one of the divided RF signal to the sixth power divider 346 and the remaining divided RF signal to the third delay line 333. The RF signal delayed by the third delay line 333 is divided by the third power divider 343, and one of the divided signals is applied to the eighth power divider 348 and the remaining divided RF signal to the power combiner 315.

The RF output signal of the second power divider 342 is divided by the sixth power divider 346, and one of the divided RF signals is applied to the first signal canceler 313 and the remaining divided RF signal to the first attenuation/phase controller 321. The delayed RF output signal from the first delay line 331 is divided by the fourth power divider 344. One of the divided output signals from the fourth power divider 344 is applied to the first variable attenuator 322 and the remaining divided signal is applied to the second delay line 332. The first variable attenuator 322 controls amplitude of the RF signal output from the fourth power divider 344 according to the first attenuation control signal ATC1 generated from the first attenuation/phase controller 321 and applies its output signal to the first variable phase shifter 323. The first variable phase shifter 323 controls phase of the RF signal output from the first variable attenuator 322 according to the first phase control signal PIC1 generated from the first attenuation/phase controller 321, and applies its output signal to the fifth power divider 345.

The first attenuation/phase controller 321 directly compares the output signal DS11 from the fifth power divider 345 with the output signal DS12 from the sixth power divider 346, to generate the first attenuation control signal ATC1 and the first phase control signal PIC1 for controlling the amplitude and phase of the RF input signal. The first attenuation control signal ATC1 controls the RF signal from the fourth power divider 344 such that the first variable attenuator 322 generates the output signal having the same amplitude as that of the amplified RF signal output from the main power amplifier 311. The first phase control signal PIC1 controls phase of the RF signal from the first variable attenuator 322 such that the first variable phase shifter 323 generates the output signal having the opposite phase to that of the RF signal output from the main power amplifier 311.

The fifth power divider 345 divides the RF signal whose amplitude and phase are controlled, to apply one of the divided signals to the first attenuation/phase controller 321 and the remaining divided signal to the first signal canceler 313. The first signal canceler 313 cancels the RF output signal of the fifth power divider 345 from the amplified RF signal of the main power amplifier 311, to extract the intermodulation distortion signals only.

The third variable attenuator 328 controls amplitude of the intermodulation distortion signals generated from the first signal canceler 313 according to the third attenuation control signal ATC3 generated from the third attenuation/phase controller 327. The third variable phase shifter 329 controls phase of the intermodulation distortion signals from the third variable attenuator 328 according to the third phase control signal PIC3 from the third attenuation/phase controller 327. The error amplifier 312 amplifies the intermodulation distortion signals whose amplitude and phase are controlled, and applies the output signals to the ninth power divider 349.

The eighth power divider 348 divides the amplified RF signal output from the third power divider 343, to apply one of the divided signals to the second signal canceler 314 and the other divided signal to the second attenuation/phase controller 324. The divided output signal from the fourth power divider 344 is delayed by the second delay line 332, and applied to the second variable attenuator 325. The second attenuator 325 controls amplitude of the delayed RF signal output from the second delay line 332 according to the second attenuation control signal ATC2 from the second attenuation/phase controller 324. The second variable phase shifter 326 controls phase of the amplitude-controlled RF signal according to the second phase control signal PIC2 from the second attenuation/phase controller 324. The second attenuation/phase controller 324 compares amplitude and phase of the output signal DS21 from the seventh power divider 347 with amplitude and phase of the output signal DS22 from the eighth power divider 348, to generate the second attenuation control signal ATC2 and the second phase control signal PIC2. The second attenuation control signal ATC2 and the second phase control signal PIC2 control the second variable attenuator 325 and the second variable phase shifter 326 such that the output signal of the seventh power divider 347 has the same amplitude and the opposite phase to those of the output signal of the eighth power divider 348.

The second signal canceler 314 cancels the output signal of the seventh power divider 347 from the output signal of the eighth power divider 348 to extract the intermodulation distortion signals only. The third attenuation/phase controller 327 compares amplitude and phase of the intermodulation distortion signal DS31 with amplitude and phase of the divided output signal DS32 of the ninth power divider 349, to generate the third attenuation and phase control signals ATC3 and PIC3. The third attenuation and phase control signals ATC3 and PIC3 respectively control the third variable attenuator 328 and the third variable phase shifter 329 such that the output signal of the ninth power divider 349 has the same amplitude and the opposite phase to those of the output signal of the third power divider 343. The power combiner 315 combines the output signal of the third power divider 343 with the output signal of the ninth power divider 349, having the same amplitude and opposite phase, to cancel the intermodulation distortion signals included in the RF signal.

In summary, the feedforward-type linear power amplifier according to the present invention directly compares amplitude and phase of the signal applied to one input end of the first signal canceler 313 with amplitude and phase of the signal applied to another input end of the first signal canceler 313, and according to the comparison results, controls the first variable attenuator 322 and the first variable phase shifter 323 disposed in a pre-stage of the first signal canceler 313 so that the first signal canceler 313 extracts only the intermodulation distortion signals generated while the main power amplifier 311 amplifies the RF input signal. Next, the linear power amplifier directly compares amplitude and phase of the intermodulation distortion signal on the main path with amplitude and phase of the intermodulation distortion signal on the sub path, and according thereto, controls the third variable attenuator 328 and the third variable phase shifter 329 to cancel the intermodulation distortion signals included in the RF output signal of the main power amplifier 311.

As can be appreciated from the foregoing, the feedforward-type linear power amplifier employs the average power detector and the phase detector for detecting the relative phase difference between input signals, to directly compare amplitude and phase of the RF signal on the main path with amplitude and phase of the RF signal on the sub path, so as to cancel the intermodulation distortion signals included in the amplified RF signal in real time.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed is:

1. A feedforward-type linear power amplifier including a power amplifier for amplifying an RF (Radio Frequency) input signal, comprising:
    a first attenuation/phase controller for comparing amplitude and phase of the amplified signal with amplitude and phase of the RF input signal to control the amplitude and phase of the RF input signal;
    a first signal canceler for canceling the signal whose amplitude and phase are controlled by said first attenuation/phase controller, from said amplified signal, so as to extract intermodulation distortion signals from said amplified signal;
    a second attenuation/phase controller for comparing amplitude and phase of the amplified signal with amplitude and phase of the RF input signal, to control the amplitude and phase of the RF input signal, said amplified signal and said RF input signal being delayed respectively by first and second delay lines;
    a second signal canceler for canceling the signal whose amplitude and phase are controlled by said second attenuation/phase controller, from said amplified delay signal, so as to extract intermodulation distortion signals from said amplified delay signal;
    a third attenuation/phase controller for comparing amplitude and phase of an output signal of said second signal canceler with amplitude and phase of an output signal of an error amplifier, to control the amplitude and phase of the extracted intermodulation distortion signal; and
    a device including said error amplifier, for amplifying the intermodulation distortion signal whose amplitude and phase are controlled by said third attenuation/phase controller, and combining the amplified intermodulation distortion signal with said amplified signal to cancel the intermodulation distortion signals included in said amplified signal.

2. A feedforward-type linear power amplifier as claimed in claim 1, wherein said first to third attenuation/phase controllers each comprises an attenuation controller and a phase controller.

3. A feedforward-type linear power amplifier as claimed in claim 2, wherein said attenuation controller comprises:
    a first switch for switching by turns first and second input signals;
    an average power detector for detecting an average power of an output signal of said first switch;
    a second switch for switching an output signal of said average power detector to generate first and second output signals; and
    a comparator for comparing said first output signal with said second output signal to generate an attenuation control signal.

4. A feedforward-type linear power amplifier as claimed in claim 3, wherein said average power detector comprises:
    a push-pull divider for dividing said RF input signal into first and second divided RF signals having opposite phases;
    first and second matching circuits for matching a characteristic impedance of a current detecting element at an operating frequency with an output characteristic impedance of said push-pull divider;
    first and second ultrahigh frequency diodes constituting said current detecting element, for detecting currents corresponding to the RF signals provided from said first and second matching circuits; and
    a current-voltage converter for converting said currents detected by the first and second ultrahigh frequency diodes into a DC voltage, to detect the average power of the RF input signal.

5. A feedforward-type linear power amplifier as claimed in claim 3, wherein said average power detector comprises:
   a matching circuit for receiving the RF input signal, and matching an input characteristic impedance of a push-pull divider with a characteristic impedance of a current detecting element;
   said push-pull divider for dividing an RF signal output of said matching circuit into first and second divided RF signals having opposite phases;
   first and second ultrahigh frequency diodes constituting said current detecting element, for detecting currents from said first and second divided RF signals; and
   a current-voltage converter for converting said currents detected by the first and second ultrahigh frequency diodes into a DC voltage, to detect the average power of the RF input signal.

6. A feedforward-type linear power amplifier as claimed in claim 2, wherein said phase controller comprises:
   a phase detector including an in-phase power synthesizer for vector-synthesizing the RF input signals and a voltage detector for detecting a voltage level of the synthesized RF signal, said phase detector analyzing amplitude of said detected voltage to detect relative phase difference information between said RF input signals; and
   a comparator for comparing an output of said phase detector with a reference voltage to generate a phase control signal.

7. A method for canceling an intermodulation distortion signal in a feedforward-type linear power amplifier including a power amplifier for amplifying an RF input signal, comprising the steps of:
   (a) comparing amplitude and phase of the amplified signal with amplitude and phase of the RF input signal to control the amplitude and phase of the RF input signal;
   (b) canceling the signal whose amplitude and phase are controlled in said step (a), from said amplified signal, so as to extract intermodulation distortion signals from said amplified signal;
   (c) comparing amplitude and phase of the amplified signal with amplitude and phase of the RF input signal to control the amplitude and phase of the RF input signal, said amplified signal and said RF input signal being delayed respectively by first and second delay lines;
   (d) canceling the signal whose amplitude and phase are controlled in said step (c), from said amplified delay signal, so as to extract intermodulation distortion signals from said amplified delay signal;
   (e) comparing amplitude and phase of said intermodulation distortion signals extracted in said step (d) with amplitude and phase of an output signal of an error amplifier, to control the amplitude and phase of the extracted intermodulation distortion signals; and
   (f) amplifying the intermodulation distortion signal whose amplitude and phase are controlled in said step (e) and combining the amplified intermodulation distortion signal with said amplified signal to cancel the intermodulation distortion signals included in said amplified signal.

8. A method for canceling an intermodulation distortion signal as claimed in claim 7, wherein said steps (a), (c), and (e) each comprises the steps of controlling attenuation of an input signal, and controlling phase of an input signal.

9. A method for canceling an intermodulation distortion signal as claimed in claim 8, wherein said attenuation controlling step comprises the steps of:
   (g) switching by turns first and second input signals;
   (h) detecting an average power of said first and second input signals being switched in said step (g);
   (i) switching said detected average power to generate first and second output signals; and
   (j) comparing said first output signal with said second output signal to generate an attenuation control signal.

10. A method for canceling an intermodulation distortion signal as claimed in claim 9, wherein said average power detecting step (h) comprises the steps of:
    dividing said RF input signal into first and second divided RF signals having opposite phases;
    matching a characteristic impedance of a current detecting element with an output characteristic impedance of a push-pull divider;
    detecting currents corresponding to said impedance-matched RF signals; and
    converting said detected currents into a DC voltage to detect average power of the RF input signal.

11. A method for canceling an intermodulation distortion signal as claimed in claim 9, wherein said average power detecting step (h) comprises the steps of:
    receiving the RF input signal, and matching an input characteristic impedance of a push-pull divider with a characteristic impedance of a current detecting element;
    dividing said impedance-matched RF signal into first and second divided RF signals having opposite phases;
    detecting currents from said first and second divided RF signals; and
    converting said detected currents into a DC voltage to detect the average power of the RF input signal.

12. A method for canceling an intermodulation distortion signal as claimed in claim 8, wherein said phase controlling step comprises the steps of:
    vector-synthesizing the RF input signals;
    detecting a voltage level of the synthesized RF signal, and analyzing amplitude of said detected voltage to detect relative phase difference information between said RF input signals; and
    comparing said relative phase difference information with a reference voltage to generate a phase control signal.

* * * * *